United States Patent [19]

Hamakawa et al.

[11] 4,453,184
[45] Jun. 5, 1984

[54] SOLID STATE IMAGING DEVICE

[75] Inventors: Yoshihiro Hamakawa, Hyogo; Yosuke Nakajima, Tokyo, both of Japan

[73] Assignee: Fuji Photo Film Co., Ltd., Kanagawa, Japan

[21] Appl. No.: 329,097

[22] Filed: Dec. 9, 1981

[30] Foreign Application Priority Data

Dec. 12, 1980 [JP] Japan .................. 55-175508

[51] Int. Cl.³ .............................................. H04N 3/14
[52] U.S. Cl. .................................................. 358/213
[58] Field of Search ............. 358/213, 41; 250/211 R; 313/388

[56] References Cited

U.S. PATENT DOCUMENTS 4,005,327  1/1977  Roosild et al. ...................... 313/388
4,348,611  9/1982  Ruppel et al. ....................... 358/213

Primary Examiner—Richard Murray
Attorney, Agent, or Firm—Sughrue, Mion, Zinn, Macpeak & Seas

[57] ABSTRACT

A solid state imaging device using a non-crystalline semiconductor material as a photoconductive member. The photoconductive member is arranged in repetitive p-i-n layers such that an opto electromotive force is developed sufficient to drive charges to an integrated scanning circuit even in the absence of an external bias voltage.

16 Claims, 3 Drawing Figures

SOLID STATE IMAGING DEVICE

BACKGROUND OF THE INVENTION

This invention relates to solid state imaging devices, and more particularly to a solid state imaging device having an optical detector section of non-crystalline silicon.

A conventional solid state imaging device comprises an optical detector section having photo-diodes arranged in a matrix form, and a scanning circuit for successively selecting signals detected by the optical detector section. One example of a conventional solid state imaging device, comprising an optical detector section matrix in combination with a field-effect transistor circuit for X-Y scanning (hereinafter referred to as "an X-Y matrix type solid state imaging device", when applicable), is disclosed in the specification of Japanese Patent Publication No. 30768/1970. Other examples, comprising an optical detector section matrix in combination with a bucket brigade device (BBD), a charge coupled device (CCD) or a CPT type charge transfer section are disclosed in the specifications of Japanese Patent Application (OPI) Nos. 1221/1971 and 26091/1972 (the term "OPI" as used herein refers to a "published unexamined Japanese patent application") and in *Electronic Materials* (*Denshizairyo*), March 1980, page 6 et seq. In these conventional devices, the optical detector section and a circuit for successively selecting signals detected by the optical detector section (including the X-Y matrix circuit, the charge transfer circuit and a switching element, namely, a field-effect transistor for delivering charges to these circuits) are arranged two-dimensionally on a single surface. Consequently, a disadvantage of the conventional devices is that its light utility efficiency per unitary area is extremely low, i.e., only a relatively small part of the semiconductor surface area is used for detecting light.

Recently, a solid state imaging device for a multilayer structure has been proposed which is obtained by superimposing a photoconductive element on the scanning circuit. A solid state imaging device comprising a photoconductive element is superimposed on an X-Y matrix type scanning circuit using field-effect transistors (FET's) is disclosed in the specification of Japanese Patent Application (OPI) No. 91116/1974. A solid state imaging device comprising a vacuum-evaporated polycrystalline film using the hetero-junction of compound semiconductors in Groups II-VI formed on a BBD or CCD type scanning circuit is disclosed in the specification of Japanese Patent Application (OPI) No. 2777/1980. These devices have the advantage of enlarging the light detecting area of the imaging device.

Attempts have been made to use non-crystalline silicon for solar cells or electrophotographic sensitized materials. The term "non-crystalline silicon" as used herein is intended to refer to silicon not all of which have a periodic atomic arrangement and which is different from that which has a regular atomic arrangement. Accordingly, conventional non-crystalline silicon has poor photoelectric characteristics because of its lack of regularity in the arrangement of atoms. However, it has been found that a non-crystalline silicon containing hydrogen and/or fluorine has a large photoconductivity characteristic with a relatively high resistivity ($10^8$ to $10^9$ $\Omega$-cm). Hydrogen and fluroine decrease the gap state of electrons and holes in the energy gap of non-crystalline silicon. A more important finding is that valence electron control can be effected for non-crystalline silicon similarly as in the case for crystalline silicon (as disclosed in *Solid State Communication* by W. E. Spear and P. G. LeComber, Vol. 17 (1975), page 1193 et seq.). A significant amount of attention has been paid to the characteristics and applications for non-crystalline silicon particularly to its application to photovoltaic devices as described in *Applied Physics Letters* by D. E. Carlson and C. R. Wronski, Vol. 28 (1976), page 671 et seq.

Japanese Patent Application (OPI) No. 39404/1980 describes the use of non-crystalline silicon as a photoconductive element in the above-described multilayer structure solid state imaging device. As described there a single layer of non-crystalline silicon is electrically connected to the source or drain electrode of a field-effect transistor in an X-Y matrix type or charge transfer type scanning circuit which is combined with MOS field-effect transistors arranged in a matrix form, and a transparent electrode is formed on the single layer of non-crystalline silicon.

SUMMARY OF THE INVENTION

In accordance with the present invention an improved solid state imaging device of the type using non-crystalline silicon (hereafter sometimes referred to as a-Si) as the light detecting medium is provided. As contrasted with the prior proposals for using a-Si, in the present invention plural layers of a-Si are provided. Specifically, a plurality of repetitive layers are superimposed on one another, each repetitive layer consisting of a p-type semiconductor sublayer, an intrinsic semiconductor sublayer, and an n-type semiconductor sublayer. The combination of repetitive layers is laminated on the semiconductor scanning circuit. In contrast with the devices using a single a-Si layer, the present invention does not require biasing of the a-Si layers.

The non-crystalline material essentially containing silicon employed in the present invention is not limited to a non-crystalline silicon containing hydrogen or the like. A part of a non-crystalline silicon containing hydrogen or the like can be replaced by carbon or the like which is an element in the same group as silicon, or an impurity element such as oxygen or nitrogen can be contained in the silicon. Hereinafter, these materials will be referred to as "non-crystalline silicon".

An object of this invention is to provide a solid state imaging device in which non-crystalline silicon is employed as the optical detector.

Another object of the invention is to provide a solid state imaging device which is operated without application of a bias voltage or which is operated with application of an extremely low bias voltage.

The foregoing objects and other objects of the invention have been achieved by the provision of a solid state imaging device in which a transparent electrode and a photoconductive layer are arranged in the direction of incidence of light in the stated order, and a plurality of scanning circuits are provided to successively select a signal of the photoconductive layer; in which, according to the invention, the photoconductive layer is made of a valence electron controllable non-crystalline material essentially containing silicon by laminating a plurality of repetitive units each consisting of a p-type semiconductor layer, an intrinsic semiconductor layer and an n-type semiconductor layer, in such a manner that adjacent semiconductor layers are different in electrical conductivity.

DETAILED DESCRIPTION OF THE INVENTION

One embodiment of this invention will be described with reference to the accompanying drawings.

Figure 1:
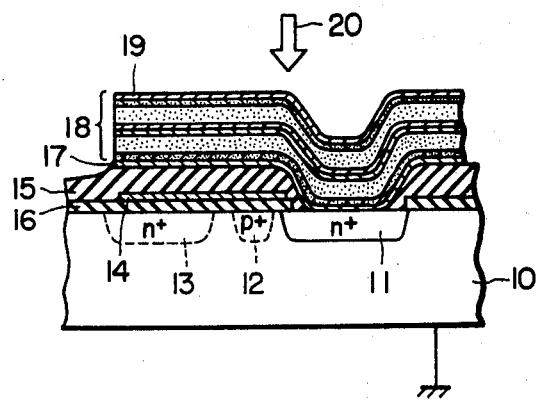
FIG. 1 is a sectional view of one unit of a solid state imaging device according to this invention.

FIG. 1 is a sectional view showing the structure of one unit or pixel of a solid state imaging device. It is well known in the art that a solid state imaging device consists of a matrix of pixels, each pixel corresponding essentially to a spot in a picture. Details of such solid state imaging devices which are not novel features of the present invention will not be described herein as such features are well known in the art, and their inclusion here would unnecessarily encumber the description of the novel features of the invention. In the embodiment, a diode is formed with an n+ type region 11 in a p-type semiconductor substrate 10. A p+ type region 12 is a potential barrier for preventing the injection of electrons from the n+ type region 11 in a CCD operation. An n+ type region 13 is a potential well in a BBD operation. The regions 12 and 13 are provided only in the CCD operation and the BBD operation, respctively.

The embodiment will be described with reference to the BBD operation. In FIG. 1, reference numeral 14 designates a first gate electrode which partially overlaps the n+ type region 11; 16, a gate oxide film serving as an insulating film between the semiconductor substrate 10 and the first gate electrode 14; 15, an insulating layer which electrically isolates a first electrode 17 from the semiconductor substrate 10 and the first gate electrode 14; 17, the aforementioned first electrode which is connected to the n+ type region 11; 18, a photoconductive layer of non-crystalline silicon; and 19, a transparent electrode formed on the non-crystalline silicon layer. The photoconductive layer 18 is obtained by laminating repetitive units each consisting of a p-type semiconductor layer, an intrinsic semiconductive layer and an n-type semiconductor layer (hereinafter referred to merely as "a p-layer", "an i-layer" and "an n-layer", or "p", "i" and "n", respectively, when applicable) in such a manner that adjacent semiconductor layers are different in electrical conductivity (or the p-type semiconductor layer of one repetitive unit and the n-type semiconductor layer of another repetitive unit are adjacent to each other). The layer 18 forms a photo-detector section.

Figure 2:
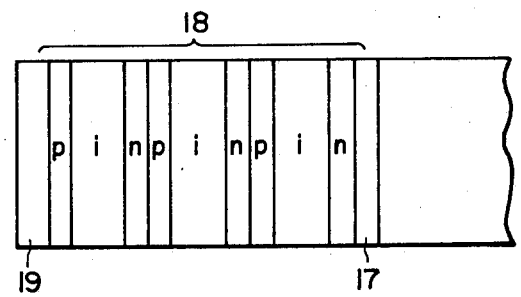
FIG. 2 is an explanatory diagram showing the sectional structure of an optical detector section of the device shown in FIG. 1.

The order of lamination of the layers (i.e., the p, i and n layers) of the repetitive units of the photoconductive layer 18 is as shown in FIG. 2 in the case where a scanning circuit is of a p channel FET. More specifically, the layers should be laminated in the order of p, i and n in the direction of application of light. When the scanning circuit is of an n channel FET, the layer should be laminated in the order of n, i and p in the direction of application of light.

When light 20 is applied to the photo-detector section of the solid state imaging device thus constructed, the p-i-n photo diodes of non-crystalline silicon laminated in the form of plural layers absorb the light to form pairs of electrons and holes, which are brought to the electrodes 17 and 19 by the optical electromotive force, to decrease the potential of the electrode 17. The amount of decrease of the potential is proportional to the amount of incident light and is accumulated for one field period of the scanning system.

Next, when a read signal voltage is applied to the first gate electrode 14, the surface potential of the semiconductor below the first gate electrode 14 is increased, as a result of which electrons are transferred into the n+ region 13 from the n+ region 11, and accordingly the potential of the n+ region 11 is restored. Thus, the total amount of charge moved to the n+ region 13 is proportional to the intensity of illumination of the incident light.

The photo-detection and charge transfer operations of a single pixel or unit of the solid state imaging device has been described. The further charge transfer of a photoelectric conversion signal in n+ type region 13 is carried out in a conventional manner. For example, the charge transfer can be achieved by self-scanning described below.

Figure 3:
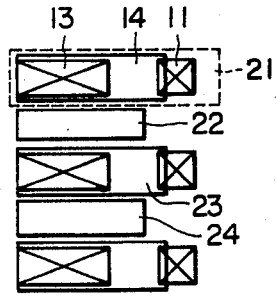
FIG. 3 is a plan view showing a plurality of units shown in FIG. 1, which are arranged one-dimensionally.

FIG. 3 is a plan view showing units of solid state elements shown in FIG. 1 which are arranged one-dimensionally. In FIG. 3, reference numeral 21 designates one pixel or unit of the solid state imaging device. The plan or dimensions of the charge storage and switching portion of the pixel are represented by a broken line. Second gate electrodes 22 and 24 are provided between the first electrodes 14 and 23 of adjacent units. Charges transferred to region 13 by the first electrode 14 is as described above, are further transferred, in a charge transfer mode, to a region of the semiconductor below the second gate electrode 22 by application of a transfer pulse in a manner well known. The charges thus transferred are transferred to an output stage successively through the first gate electrode 23 and the second gate electrode 24 according to the same principle as that described above. That is, the signal subjected to photoelectric conversion in the photo-detector section can be delivered to the output stage by a two-phase clock pulse signal.

The switching scanning circuit described above is of the charge transfer type, e.g., CCD or BBD circuits. However, an X-Y matrix type scanning circuit as disclosed, for instance, in the specification of Japanese Patent Application (OPI) No. 91116/1974 may be employed. In addition, instead of the above-described field-effect transistor circuit, a film type field-effect transistor circuit formed on a glass support, as disclosed in *Proceeding of the IEEE*, the Institute of Electrical and Electronics Engineers, Inc., Dec. 1964, Vol. 52, No. 12, pp. 1479–1486 may be used. Furthermore, the scanning circuit can be formed with conventional semiconductor switching circuits.

The operation of the photo-detector section employed in the invention, and a method of manufacturing the photo-detector section will be described.

The specific feature of the solid state imaging device according to the invention resides in that a valence electron controllable non-crystalline silicon is formed by laminating a plurality of repetitive units each consisting of p, i and n on the above-described scanning circuit in such a manner that the layers of adjacent repetitive units are different in electrical conductivity.

When such a p-i-n multilayer structure is used, a field-effect due to the optical electromotive force of the solid state imaging device can be obtained without the bias voltage of the device. A principle for this will be described. In general, a p-n junction, unlike a p-i-n junction, shows a very low rectification characteristic. In an element having p-i-n and p-n junctions the rectification characteristic depends on the p-i-n junctions of the repetitive units, and the p-n junctions between the repetitive units scarcely contribute to the rectification characteristic. That is, if a simple structure of p-i-n/p-i-n . . . /p-i-n (hereinafter expressed as "(p-i-n)$_m$", when applicable) is formed, the n/p junctions between the p-i-n units serve merely as a low resistance junction, and a multilayer structure optical electromotive force element is formed. In other words, in the n/p junction connecting the p-i-n units, electrons and holes produced in a tunnel recombination mode are recombined, and therefore one current path is formed in the element.

In practice, such a p-i-n multilayer structure can be readily manufactured by a glow discharge method. The structure can be formed by successively and repeatedly forming the n-layer with a gas $SiH_4+PH_3$, the i layer with a gas $SiH_4$ and the p-layer with a gas $SiH_4+B_2H_6$ for instance on a stainless steel plate or a substrate covered with a conductive film. As the speed of deposition is relatively low, the thickness of each layer can be relatively readily controlled. This method is utilized in the invention, to form the p-i-n multilayer structure non-crystalline silicon on the electrode 17 in FIG. 1. The non-crystalline silicon can be formed by the conventional glow discharge method or by a sputtering method which is carried out in an atmosphere including hydrogen and/or fluorine gas. By way of example, a method of manufacturing the non-crystalline silicon according to the glow discharge method will be described.

In a manufacturing method according to glow discharge decomposition, a compound containing silicon is decomposed by glow discharge to allow non-crystalline silicon to deposit on the substrate. Examples of the compound are $SiH_4$, $SiF_4$, $SiHF_3$, $SiH_3Cl$ and $SiH_2Cl_2$ which are represented by a general formula $SiH_xX_{4-x}$ (where X is F, Cl or I, and x=0 to 4 (an integer)), or mixtures of these compounds. In order to form a high resistance film having a combination of Si—C, Si—O or Si—N, a gas $CH_4$, $O_2$, $NO_2$ or $NH_3$ may be mixed with the above-described gas. These compounds are normally gaseous, and they are used as they are or they are used after being diluted with inert gas such as Ar, He or Xe or gas such as $H_2$. When a silicon compound containing no hydrogen or fluorine is used, it is essential to use hydrogen or fluorine in combination therewith. The gas in a container for glow discharge is, in general, maintained at $10^{-2}$ to 10 Torr. A direct current, or an alternating current, or a current obtained by superposing the direct current and alternating current may be applied between the electrode and the substrate. In the use of the alternating current, a frequency from 1 Hz to 4,000 MHz may be employed. In forming the above-described non-crystalline silicon film, the amount of doping hydrogen is 10 to 40 atomic percent. The non-crystalline silicon film can also be formed by other methods, such as sputtering and ion plating.

The electrical conductivity type of the non-crystalline silicon thus manufactured is slightly n-type; however, its valence electron control can be made by doping. That is, p-type properties can be given to the non-crystalline silicon by doping it with a small amount of boron. Thus, an intrinsic semiconductor (i-type semiconductor) can be formed, and a p-type semiconductor can be formed. Furthermore, an n-type semiconductor can be formed by adding, for instance, phosphorus. Suitable examples of the doping impurities are elements in Group III of the Periodic Table, such as B, Al, Ga, In and Tl in the formation of the p-type semiconductor, and are elements in Group V of the Periodic Table, such as N, P, As, Sb and Bi in the formation of the n-type semiconductor. As the contents of these impurities are extremely small, the risk of public hazard due to their use in not serious. However, it is desirable to use impurities which are the least harmful. In view of this requirement, and the electrical and optical characteristics of a photoconductive layer, boron and phosphorus are most suitable dopants.

The quantity of impurities doped into the non-crystalline semiconductor according to the invention is suitably determined according to desired electrical and optical characteristics; however, it is desirable that in the case of elements in Group III of the Periodic Table it is $10^{-6}$ to 5 atomic percent, preferably $10^{-5}$ to 1 atomic percent, and in the case of elements in Group V of the Periodic Table it is $10^{-6}$ to 1 atomic percent, preferably $10^{-4}$ to $10^{-1}$ atomic percent.

The exact quantity of doping impurities are not critical and will depend on the temperature of the substrate.

By the above-described doping technique, the p-i-n multilayer type non-crystalline silicon is formed as the optical detector section of the invention.

Concrete examples of the thicknesses of the layers which are required for obtaining an electric field necessary for the optical detector section of the solid state imaging device are as follows: The thickness of the p-layer is preferably of the order of 50 to 100 Å with the ratio of $B_2H_6/SiH_4$ being 0.1% and being doped with boron. The thickness of the n-layer is preferably of the order of 100 to 500 Å with the ratio of $PH_3/SiH_4$ being 0.2% and being doped with phosphorus. These thicknesses can be obtained by glow discharge with the substrate at 200° to 300° C. In the case where the thickness of the p-layer of the first unit from the light incidence side is about 100 Å, the thickness of the n-layer of the last (or the m-th) unit is about 500 Å, and the thicknesses of the p-layers and the n-layers between the aforementioned p- and n-layers are about 50 Å and about 100 Å, respectively, the best data for the thickness di of each i-layer are as indicated in the following Table 1:

TABLE 1

| m | $di_1$ | $di_2$ | $di_3$ | $di_4$ | $di_5$ |
|---|---|---|---|---|---|
| 2 | 500 | 5,000 | | | |
| 3 | 350 | 900 | 5,000 | | |
| 4 | 150 | 450 | 1,400 | 5,000 | |
| 5 | 110 | 300 | 700 | 1,700 | 5,000 |

(Unit: Å)

However, this data for the thickness of the i-layer should not be considered as limits on their thickness. That is, as a result of experiments, the inventors have found that an electric field of 4.5 V, sufficient as the bias voltage of the optical detector section of the solid state imaging device, can be obtained by application of sunlight to a photoconductor constructed as described above and having ten layers of p-i-n, with each i-layer having a thickness of 500 Å.

As the number (m) of layers of the p-i-n repetitive units according to the invention is increased, the conversion percentage is slightly decreased. However, the conversion percentage is about 3.6 to 4.1% in the case of an a-Si photoconductor having five repetitive p-i-n layers and the voltage is increased in proportion to the number (m) of layers. However, even with two p-i-n layers a voltage of 1 V or higher is induced in the optical detector section of the solid state imaging device, and with three p-i-n layers or more the voltage induced is of the order of 2 V and up. Thus, it is necessary to provide at least two repetitive p-i-n layers as the photoconductor layer.

The invention has been described with reference to the case where the electrons and holes paired in the photoconductive layer migrate to the source or drain region of the field-effect transistor under the influence only of the optical electromotive force of the non-crystalline silicon made up of the repetitive p-i-n layers, without using the bias voltage; however, the invention is not limited thereto or thereby; that is, a bias voltage may be applied to supplement the optical electromotive force.

The same non-crystalline silicon film as that described above can be obtained by subjecting silicon to high frequency or DC sputtering in an atmosphere containing a hydrogen gas or $SiH_4$ gas. The transparent electrode 19 is obtained by forming a transparent electrode containing $In_2O_3$ or $SnO_2$ into one having a thickness of 0.05 to 0.5 $\mu$.

What is claimed is:

1. A solid state imaging device of the type having a photoconductive layer and a scanning circuit in cooperative relationship, the improvement comprising:
   said photoconductive layer being a valence electron controllable non-crystalline material essentially containing silicon and being made up of a plurality of repetitive p-i-n layers, each said repetitive p-i-n layer comprising a p-type sublayer, an n-type sublayer and an intrinsic (i) layer therebetween, said repetitive layers being positioned relative to one another such that adjacent sublayers are different in electrical conductivity.

2. A solid state imaging device as claimed in claim 1 further comprising a transparent electrode layer on the light incident surface of said photoconductive layer and a bottom electrode layer on the other surface of said photoconductor layer, and wherein said scanning circuit comprises an integrated circuit layer, said photoconductor layer with said electrodes being superimposed upon said scanning circuit and electrically connected to appropriate circuit elements in said scanning circuit via said bottom electrode.

3. A solid state imaging device as claimed in claim 2, wherein said scanning circuit comprises a plurality of p channel FET elements and wherein said p-i-n layers are arranged so that the top sublayer of the photoconductor is a p sublayer and the bottom sublayer of the photoconductor is an n sublayer.

4. A solid state imaging device as claimed in claim 2, wherein said scanning circuit comprises a plurality of n channel FET elements and wherein said p-i-n layers are arranged so that the top sublayer of the photoconductor is an n sublayer and the bottom sublayer of the photoconductor is a p sublayer.

5. A solid state imaging device as claimed in claims 3 or 4, wherein said scanning circuit is a charge coupled device circuit.

6. A solid state imaging device as claimed in claims 3 or 4, wherein said scanning circuit is a bucket brigade device circuit.

7. A solid state imaging device as claimed in claims 3 or 4, wherein said scanning circuit is an X-Y matrix MOSFET circuit.

8. A solid state imaging device as claimed in claims 1, 2, 3 or 4, wherein said plurality of repetitive p-i-n layers consists of m such layers, where m is from 2 to 10.

9. A solid stage imaging device as claimed in claim 2, wherein each of said p sublayers has a dopant concentration of $10^{-6}$ to 5 atomic percent and said dopant is selected from the group consisting of boron, aluminum, gallium, indium and tellurium, and each of said n sublayers has a dopant concentration of $10^{-6}$ to 1 atomic percent and said dopant is selected from the group consisting of nitrogen, phosphorus, arsenic, tin, and bismuth.

10. A solid state imaging device as claimed in claim 9, wherein the dopant of said p sublayers is boron at a concentration of $10^{-5}$ to 1 atomic percent and the dopant of said n sublayers is phosphorus at a concentration of $10^{-4}$ to $10^{-1}$ atomic percent.

11. A solid state imaging device as claimed in claims 1, 2, 3, 4 or 10, wherein no bias voltage is applied to said photoconductive layer.

12. A solid state imaging device comprising:
   a semiconductor integrated circuit comprising a plurality of electrical charge switching elements forming a scanning circuit;
   a photoconductive layer, formed of a valence electron controllable non-crystalline material essentially containing silicon, having a top transparent electrode and a bottom electrode, said photoconductor layer being superimposed on said integrated circuit such that spatial regions of said photoconductive layer are electrically connected to said charge switching elements, respectively, via said bottom electrode, whereby each spatial region delivers a charge to its associated switching element representative of light incident on said spatial region of said photoconductor;
   said photoconductive layer having the characteristics of responding to incident light by developing electron-hole pairs and opto electromotively driving said holes and electrons to opposite electrodes of said photoconductive layer even in the absence of an external bias voltage applied to said photoconductive layer.

13. A solid state imaging device as claimed in claim 12, wherein said photoconductive layer consists of a plurality of repetitive p-i-n layers, each consisting of a p-type sublayer, an n-type sublayer, and an intrinsic sublayer therebetween, said repetitive p-i-n layers being superimposed one on the other such that adjacent layers have different electrical conductivity.

14. A solid state imaging device as claimed in claims 12 or 13, wherein said switching elements are charged coupled devices.

15. A solid state imaging device as claimed in claims 12 or 13, wherein said switching elements are bucket brigade devices.

16. A solid state imaging device as claimed in claims 12 or 13, wherein said switching elements are MOSFETs.

* * * * *